(12) United States Patent
Messina et al.

(10) Patent No.: US 6,785,174 B2
(45) Date of Patent: Aug. 31, 2004

(54) TESTING METHOD AND DEVICE FOR NON-VOLATILE MEMORIES HAVING A LPC (LOW PIN COUNT) COMMUNICATION SERIAL INTERFACE

(75) Inventors: Marco Messina, Augusta (IT); Maurizio Perroni, Catania (IT); Salvatore Polizzi, San Giovanni La Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/447,293

(22) Filed: May 28, 2003

(65) Prior Publication Data

US 2004/0071028 A1 Apr. 15, 2004

(30) Foreign Application Priority Data

May 31, 2002 (EP) .......................................... 02425361

(51) Int. Cl.[7] .............................................. G11C 29/00
(52) U.S. Cl. .................. 365/201; 365/221; 365/189.12; 365/185.09
(58) Field of Search .................... 365/185.09, 185.33, 365/201, 221, 189.12, 239, 240

(56) References Cited

U.S. PATENT DOCUMENTS 5,596,734 A * 1/1997 Ferra .............................. 710/5
5,687,179 A 11/1997 Whetsel, Jr. et al. ........ 714/726
6,324,096 B1 * 11/2001 Tomita ..................... 365/185.05
6,442,092 B1 * 8/2002 Tomita ........................ 365/219

FOREIGN PATENT DOCUMENTS

| EP | 0651261 | 5/1995 | ....... G01R/31/3185 |
| EP | 1018746 | 7/2000 | ............ G11C/16/10 |

OTHER PUBLICATIONS

Nadeau–Dostie et al., Serial Interfacing for Embedded–Memory Testing, IEEE Design & Test of Computers, IEEE Computers Society, Los Alamitos, US, vol. 7, No. 2, Apr. 1990, pp. 52–63, XP000159643.

* cited by examiner

*Primary Examiner*—Andrew Q. Tran
(74) *Attorney, Agent, or Firm*—Lisa K. Jorgenson; Allen, Dyer, Doppelt, Milbrath & Gilchrist, P.A.

(57) ABSTRACT

An electronic memory device monolithically integrated in semiconductor has a low pin count (LPC) serial interface. The memory device includes a memory cell array and associated row and column decode circuits. The memory device also includes a bank of T-latch registers to be addressed and accessed in a test mode for serially loading specific test data therein. The serially loading includes activating a test mode of operation by an address storage block for generating a corresponding signal, enabling the bank of T-latch registers in the device to serially receive a predetermined data set, and loading test data into the T-latch registers by using a LPC serial communication protocol.

29 Claims, 3 Drawing Sheets

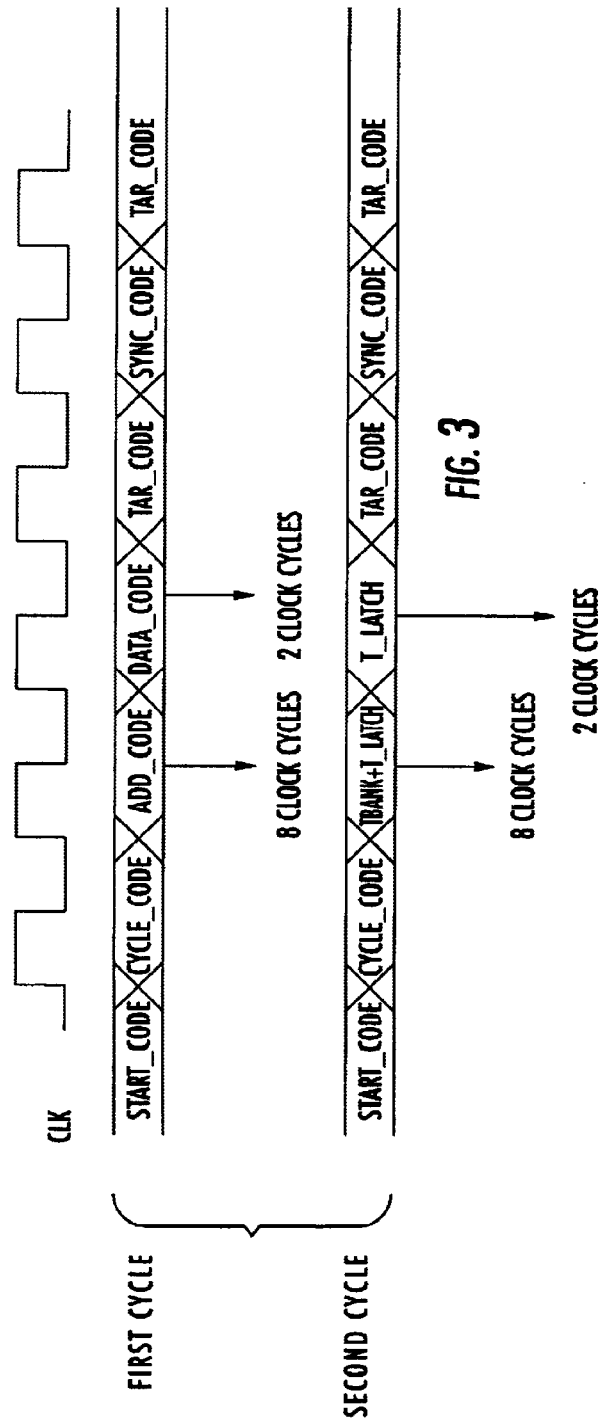

TESTING METHOD AND DEVICE FOR NON-VOLATILE MEMORIES HAVING A LPC (LOW PIN COUNT) COMMUNICATION SERIAL INTERFACE

FIELD OF THE INVENTION

The present invention relates to an electronic memory device that is monolithically integrated in semiconductor and has a low pin count (LPC) interface. Particularly, but not exclusively, the present invention relates to a standard type flash memory integrated to a LPC interface block. The resulting memory device has two communication interfaces: a serial interface and a parallel interface.

The present invention further relates to a method of testing and debugging, at the on-wafer/final test stages, integrated flash memories for PCBios applications operating on a 33 MHz PCI bus, and allows a full testing flow to be carried out to detect a large number of device faults.

BACKGROUND OF THE INVENTION

The serial interface of a flash non-volatile memory has been used in applications according to precise communication protocols. On the other hand, parallel interfaces have been used almost exclusively at the device testing stage to shorten the testing time. The integrated memory device includes on its exterior twenty address pins, sixteen data pins, and a few control pins, among which are the synchronizing or clock signal CLK and a signal for setting both IC interfaces.

All the addresses and data under consideration are used in the parallel mode, and only the clock signal CLK and another four pins are needed for the serial communication protocol. The software for the testing flow, at both the on-wafer testing (Ews) and final test (assembled-device testing) stages, is currently intended for operation in the parallel mode.

However, the necessity of producing low-cost packages involves reducing the number of outer pins, thus making the provision of a new testing flow unavoidable. The outcome is that devices come equipped with just the serial communication pins in addition to the control pins required for this mode of operation. Consequently, while a standard testing flow in the parallel mode can still be carried out on-wafer, the parallel mode can not be used from the final test stage onwards.

SUMMARY OF THE INVENTION

The underlying technical problem of the present invention is to provide a new testing mode for a device having structural and functional characteristics implemented through the serial interface instead of the parallel interface. In other words, an object of the present invention is to provide a new testing procedure based on a serial communication protocol.

The present invention is based on allowing access to the test modes that are available to the manufacturer of the device by loading the data and address registers that are accessible only in the test mode.

One aspect of the present invention is directed to an electronic memory device monolithically integrated in semiconductor and comprising a serial interface having a low pin count (LPC), an array of memory cells connected to the serial interface, and row and column decode circuits connected to the array of memory cells. A bank of T-latch registers is connected to the array of memory cells to be addressed and accessed in a test mode for serially loading test data therein.

Another aspect of the present invention is directed to a method for testing a non-volatile memory device comprising a serial interface having a low pin count, an array of memory cells connected to the serial interface, and a bank of T-latch registers connected to the array of memory cells. The method comprises activating a test mode of the non-volatile memory device via an address storage block by generating a test mode signal. The address storage block is connected to the bank of T-latch registers and the array of memory cells via a first address bus. The method further includes enabling the bank of registers to serially receive a predetermined data set via an input bus connected to the serial interface, and loading test data into the bank of T-latch registers via a serial communication protocol.

BRIEF DESCRIPTION OF THE DRAWINGS

The features and advantages of the device and the method according to the present invention will be apparent from the following description of an embodiment thereof, given by way of an example and being non-limiting with reference to the accompanying drawings.

FIG. 3 is a timing pattern of a test cycle according to the present invention;

FIG. 4 is a timing diagram of a particular protocol associated with the testing method according to the present invention.

DETAILED DESCRIPTION OF THE PREFERRED EMBODIMENTS

Figure 5:
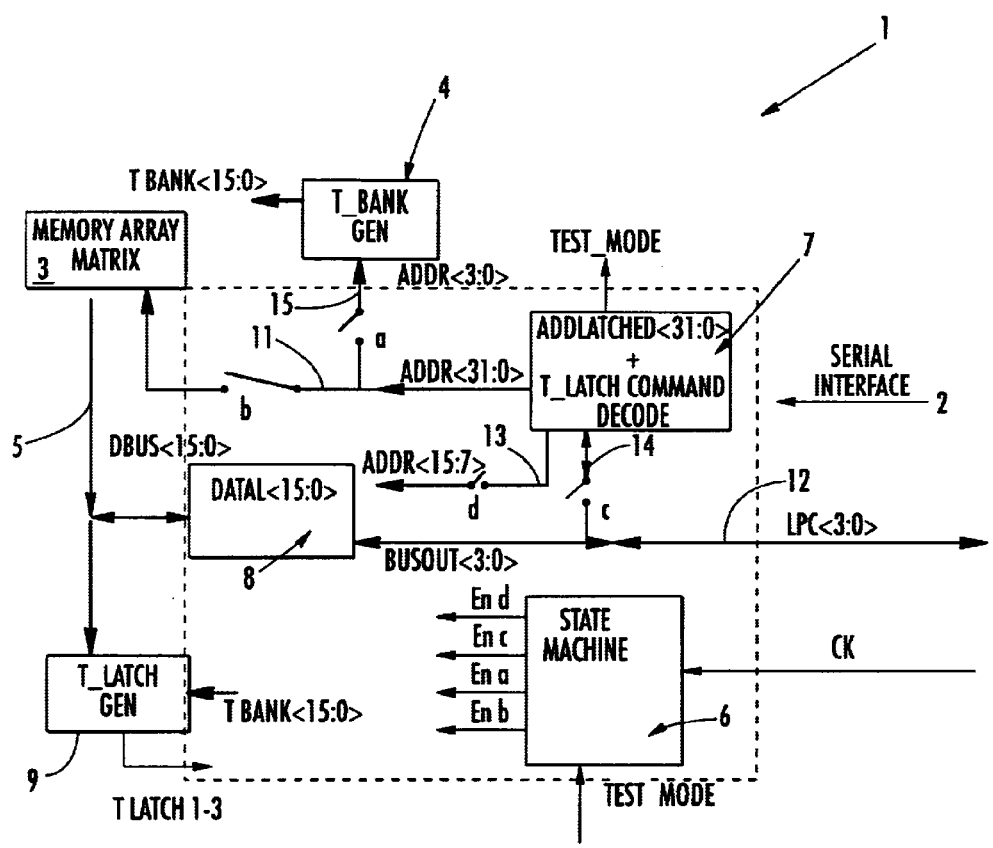
FIG. 5 is a block diagram of an electronic memory device embodying the present invention.

With reference to the drawings, in particular to the example of FIG. 5, an electronic memory device embodying the present invention is generally shown at 1 in schematic form. The device 1 is a non-volatile memory integrated in semiconductor, e.g., of the flash EEPROM type. It should be understood, however, that the considerations made herein can also be applied to other types of memory devices.

The single prerequisite is that the device 1 should include a serial interface 2 of the low pin count (LPC) type. The device conventionally comprises an array 3 of non-volatile memory cells, row and column decode circuits, as well as associated memory data read, change and erase circuit portions which are not shown because they are conventional.

The device 1 comprises a number of circuit blocks interconnected by a set of bus connections, as described below. An address storage block 7, comprising thirty-two latch registers and decode logic for the test mode command, is connected to the array 3 by an ADDR address bus 11, which includes a switch b. The block 7 generates the test mode signal TM with the logic portion incorporated therein.

A DATAL<15:0> data storage block 8 is connected to the array 3 by a DBUS data bus 5. The block 8 is loaded with external data through a BUSOUT bus 12, extending from the LPC interface 2. The data is loaded during data cycles into memory locations that are specified by a branch-off 13 of the address bus, which has a switch d connected therein and conveys the <15:7> addresses during the address cycles.

A branch-off 14 of the bus 12 is connected to the block 7 through a switch c. A number of latch registers, in particular a number of banks 4 of T-latch registers, are advantageously provided in the device 1 to be accessed via the address bus 11. More particularly, the bank 4 can be accessed through a branch-off of the address bus 11 in which a switch a is connected.

The bank 4 is closely associated with a T-latch signal generating block 9 that is accessed from the array 3 over a branch-off of the DBUS bus 5. The DBUS bus 5 operates synchronously to deliver data to the T-latch signal generating block 9. The signal generating block 9 is input additionally with the DBUS signals, and the signals from the block 4 that contain information about the relevant bank number through a sixteen-bit connection.

In a preferred embodiment, sixteen banks of sixteen T-latches each are available in the block 4. T-latches are particular registers that, once set for a suitable mode, enable the various paths required to carry out the test, irrespective of the operational state of the device.

The device 1 also incorporates a state machine 6 that generates appropriate enable signals upon receiving the clock pulse CK, as will be explained below. The state machine 6, additionally receiving the external clock signal, also receives the test mode signal TM, and generates the enable signals of all the protocol steps, further controlling operation of the switches a, b, c, d.

Of course, the switches provided in the bus connections would be elements adapted to interrupt the parallel inflow of data to each connection in the bus connection bundle. Switch a sets the T-latch bank 4, and switch b interrupts the inflow of addresses to the decode circuit portion of the array 3. Switch d allows data to be loaded into the DATAL block 8. Switch c allows the external information (LPC<3:0>) present on the bus 12, as well as on the address or data latches, to be stored according to the communication protocol under consideration.

The present invention essentially differs from conventional designs in that it contains the following: the bus connection 13 linking the address block 7 to the DATAL block 8; the connection 15 linking the address block 7 to the T-bank signal block 4; and the recognition logic connected in the control block 7 for controlling the test mode TM.

Advantageously in this invention, a test mode access is available for the device 1, meaning that the test phases usually managed only by the manufacturer can be accessed to fully analyze the device operability. Accessing in the test mode TM involves the setting of the T-latch bank in a suitable manner.

The operation of setting the T-latches is unrelated to the device cut, because only the four least-significant addresses and their respective pins are involved. For example, the ADD<3:0> addresses in FIG. 5 are adequate to set the bank 4, with sixteen bits of DBUS<15:0> data being used for setting each of the latches in the respective bank.

Figure 1:
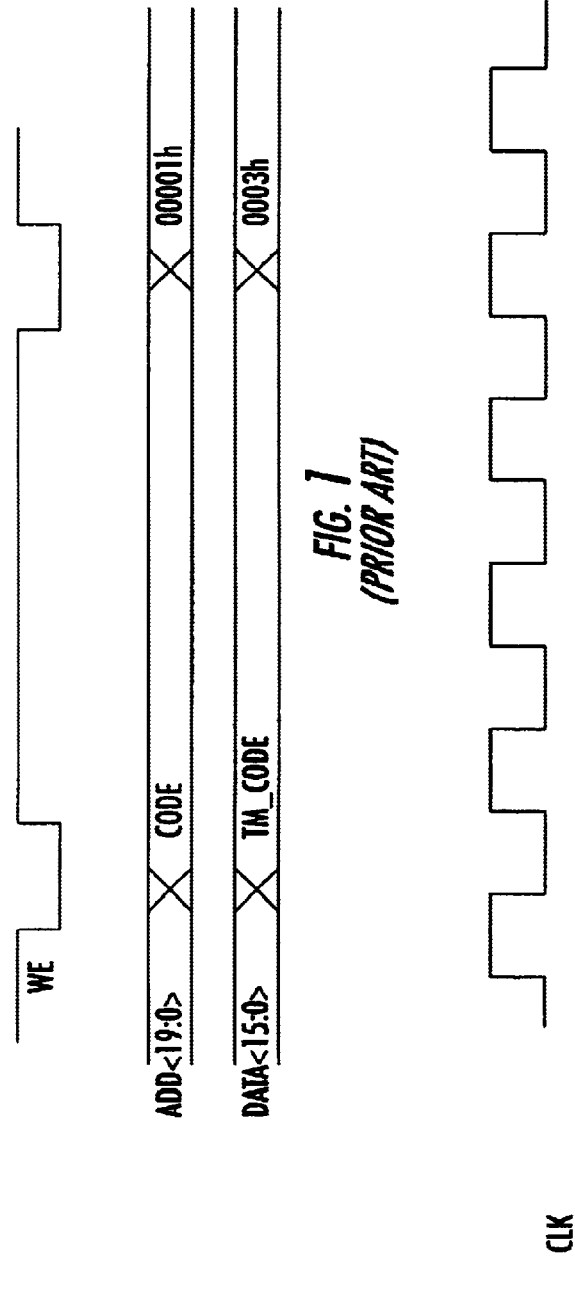
FIG. 1 is a timing pattern of a write enable signal WE for a conventional parallel test protocol according to the prior art.

Shown in FIG. 1, by way of example, is part of a parallel protocol that may be used to set T-latch 1–3, i.e., the third register in the first bank. As illustrated by the signal chart of FIG. 1, two write enable cycles WE are needed to complete this setting. In the first cycle, a TM-enter code is decoded, and in the second cycle, the relevant T-latch register is driven. Both the addresses and the data are stored based upon the rising edge of the signal WE.

Figure 2:
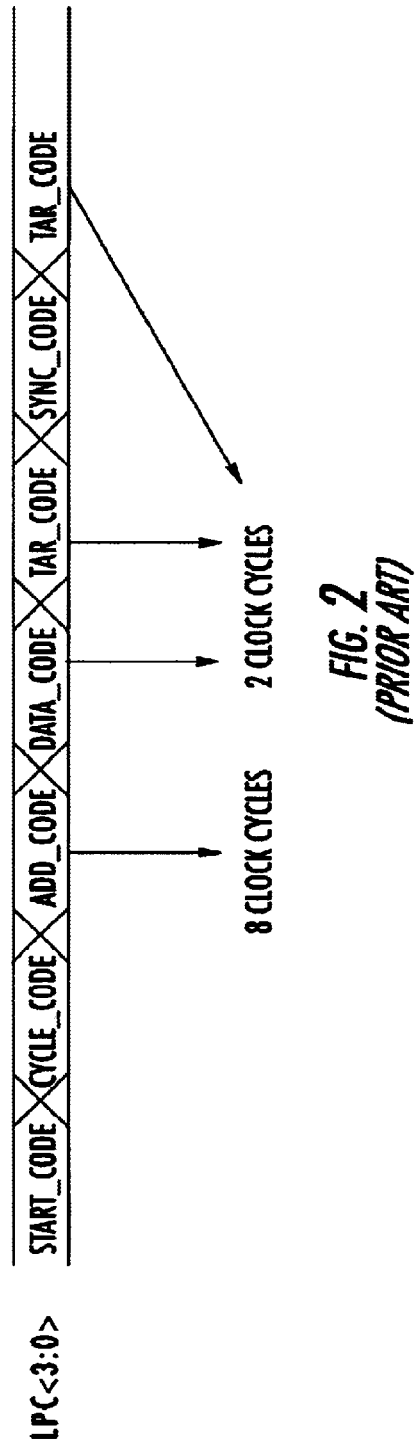
FIG. 2 is a timing pattern of a LPC protocol signal as relevant to a clock signal according to the prior art.

A conventional LPC protocol is further provided, as shown in FIG. 2. FIGS. 1 and 2 illustrate an exemplary write cycle. Decoding a command Start is what enables the remainder of the LPC protocol, while the next command Cycle Code serves to discriminate between a read step and a write step.

There then follows eight cycles, during which the addresses are driven, and two cycles, during which the data to be programmed are driven. The next two clock cycles (Tar Code) mark the moment an external host device hands control of the system bus over to the memory 3. The latter will generate a wait cycle (Sync) and then return the control of the system bus to the external host device in another two Tar Code cycles.

According to the present invention, the device 1 allows the test mode TM to be serially entered, and the necessary T-latches are set by using only four input/output pins in conformance with a LPC serial communication protocol.

Shown in FIG. 3 by way of example is a protocol, whereby the T-latch 1–3 can be set as in the previous embodiment, but in a serial manner. In this case, setting the T-latch 1–3 involves two protocol cycles, namely: a first cycle to drive the codes for entering the test mode TM; and the second cycle to select the bank and number of the T-latch as shown in FIG. 3 The eighth address loading cycle contains information about the T-latch bank 4 of interest, the sixth and seventh cycles contain information about eight data, and the two data cycles contain information about the last eight data required.

FIG. 4 shows the codes associated with the second cycle in greater detail. The data passed during the sixth and seventh address cycles, and during the two data cycles, will be stored in a bank of latches, and then synchronously conveyed to the DBUS<15:0> inner bus 5.

All the T-latch registers in one bank can be set within two full protocol cycles. With the method of the present invention, the information required to enter the test mode TM is serially transferred. The LPC serial communication protocols are recognized by the memory device on account of the T-latch register bank having been set in advance. The device architecture has been optimized to allow the user's test data to be transferred into the T-latch registers in the test mode.

That which is claimed is:

1. An electronic memory device monolithically integrated in semiconductor and comprising:

a serial interface;

an array of memory cells connected to said serial interface;

row and column decode circuits connected to said array of memory cells; and a bank of T-latch registers connected to said array of memory cells to be addressed and accessed in a test mode for serially loading test data therein.

2. An electronic memory device according to claim 1, further comprising:

an address storage block;

a first address bus connected between said array of memory cells and said address storage block; and a first switch for connecting said bank of T-latch registers to said first address bus.

3. An electronic memory device according to claim 2, wherein said address storage block comprises an internal logic unit for providing a test mode signal.

4. An electronic memory device according to claim 3, further comprising;

a data bus connected to said array of memory cells; and a T-latch signal generating block for generating signals for said bank of T-latch registers, said T-latch signal generating block being accessed from said array of memory cells via said data bus.

5. An electronic memory device according to claim 4, further comprising:

an input bus connected to said serial interface;

a data storage block connected to said array of memory cells via said data bus, and receiving data via said input bus;

a second address bus connected to said address storage block; and a second switch for connecting said data storage block to said address storage block for loading data into memory locations specified by said address storage block.

6. An electronic memory device according to claim 4, further comprising a connection bus connecting said T-latch signal generating block to said bank of T-latch registers, said connection bus comprising at least sixteen bits.

7. An electronic memory device according to claim 2, further comprising a state machine having inputs for receiving a clock signal and a test mode signal for generating at least one enable signal for said first switch.

8. An electronic memory device according to claim 1, wherein said array of memory cells is configured so that the memory device is a flash memory.

9. A memory device comprising:

a serial interface;

an array of memory cells connected to said serial interface;

an address storage block;

a first address bus connected between said array of memory cells and said address storage block;

a bank of registers to be addressed and accessed in a test mode for serially loading test data therein; and a first switch for connecting said bank of registers to said first address bus.

10. A memory device according to claim 9, wherein said address storage block comprises an internal logic unit for providing a test mode signal.

11. A memory device according to claim 9, further comprising:

a data bus connected to said array of memory cells; and a signal generating block for generating signals for said bank of registers, said signal generating block being accessed from said array of memory cells via said data bus.

12. A memory device according to claim 11, further comprising:

an input bus connected to said serial interface;

a data storage block connected to said array of memory cells via said data bus, and receiving data over said input bus;

a second address bus connected to said address storage block; and a second switch for connecting said data storage block to said address storage block for loading data into memory locations specified by said address storage block.

13. A memory device according to claim 11, further comprising a connection bus connecting said signal generating block to said bank of registers, said connection bus comprising at least sixteen bits.

14. A memory device according to claim 9, further comprising a state machine having inputs for receiving a clock signal and a test mode signal for generating at least one enable signal for said first switch.

15. A memory device according to claim 9, wherein said array of memory cells is configured so that the memory device is a flash memory.

16. A memory device according to claim 9, further comprising a semiconductor substrate, and wherein said array of memory cells, said address storage block, said bank of registers and said first switch are monolithically integrated in said semiconductor substrate.

17. A memory device according to claim 9, wherein said bank of registers comprises a bank of T-latch registers.

18. A method of testing a non-volatile memory device comprising a serial interface having a low pin count, an array of memory cells connected to the serial interface, and a bank of registers connected to the array of memory cells, the method comprising:

activating a test mode of the non-volatile memory device via an address storage block by generating a test mode signal, the address storage block being connected to the bank of registers and the array of memory cells via a first address bus;

enabling the bank of registers to serially receive a predetermined data set via an input bus connected to the serial interface; and loading test data into the bank of registers via a serial communication protocol.

19. A method according to claim 18, wherein the bank of registers is set through four input/output pins.

20. A method according to claim 18, wherein the bank of registers is set by at least two protocol cycles comprising:

a first cycle for driving the test mode for entering codes; and a second cycle for selecting the bank of registers and a number corresponding to a register to be used.

21. A method according to claim 18, wherein registers belonging to a same bank is set by two protocol cycles.

22. A method according to claim 18, further comprising connecting the bank of registers to the first address bus via a first switch.

23. A method according to claim 22, wherein the non-volatile memory further comprises a state machine having inputs for receiving a clock signal and the test mode signal for generating at least one enable signal for the first switch.

24. A method according to claim 18, wherein the address storage block comprises an internal logic unit for providing the test mode signal.

25. A method according to claim 18, wherein the non-volatile memory further comprises a data bus connected to the array of memory cells; and a signal generating block for generating signals for the bank of registers, the signal generating block being accessed from the array of memory cells via the data bus.

26. A method according to claim 25, wherein the non-volatile memory further comprises the input bus connected to the serial interface; a data storage block connected to the array of memory cells via the data bus, and receiving the predetermined data set over the input bus; a second address bus connected to the address storage block; and a second switch for connecting the data storage block to the address storage block for loading data into memory locations specified by the address storage block.

27. A method according to claim 25, further comprising a connection bus connecting the signal generating block to the bank of registers, the connection bus comprising at least sixteen bits.

28. A method according to claim 18, wherein the array of memory cells is configured so that the non-volatile memory device is a flash memory.

29. A method according to claim 18, wherein the bank of registers comprises a bank of T-Latch registers.

* * * * *